(12) United States Patent
Chi et al.

(10) Patent No.: US 12,148,793 B2
(45) Date of Patent: Nov. 19, 2024

(54) HIGH VOLTAGE SEMICONDUCTOR DEVICE COMPRISING A COMBINED JUNCTION TERMINAL PROTECTION STRUCTURE WITH A FERROELECTRIC MATERIAL

(71) Applicant: SiEn (QingDao) Integrated Circuits Co., Ltd., Qingdao (CN)

(72) Inventors: Min-Hwa Chi, Qingdao (CN); Min Li, Qingdao (CN); Richard Ru-Gin Chang, Qingdao (CN)

(73) Assignee: SiEn (QingDao) Integrated Circuits Co., Ltd., Qingdao (CN)

( * ) Notice: Subject to any disclaimer, the term of this patent is extended or adjusted under 35 U.S.C. 154(b) by 0 days.

(21) Appl. No.: 18/514,976

(22) Filed: Nov. 20, 2023

(65) Prior Publication Data
US 2024/0088216 A1 Mar. 14, 2024

Related U.S. Application Data

(62) Division of application No. 17/352,206, filed on Jun. 18, 2021, now Pat. No. 11,862,674.

(30) Foreign Application Priority Data

Jun. 23, 2020 (CN) .......................... 202010583287.0

(51) Int. Cl.
*H01L 29/06* (2006.01)
*H01L 29/10* (2006.01)
(Continued)

(52) U.S. Cl.
CPC ........ *H01L 29/063* (2013.01); *H01L 29/1095* (2013.01); *H01L 29/66681* (2013.01); *H01L 29/7816* (2013.01)

(58) Field of Classification Search
CPC .............. H01L 29/063; H01L 29/1095; H01L 29/66681; H01L 29/7816; H01L 29/1608;
(Continued)

(56) References Cited

U.S. PATENT DOCUMENTS

2012/0228704 A1* 9/2012 Ju ..................... H01L 29/66689
257/E29.256
2013/0336033 A1* 12/2013 Hirler .................. H01L 29/861
363/124

(Continued)

*Primary Examiner* — Fazli Erdem
(74) *Attorney, Agent, or Firm* — Chen Yoshimura LLP

(57) ABSTRACT

The present invention provides a high voltage semiconductor device comprising a combined junction terminal protection structure, the device comprises: an active area formed with the high voltage semiconductor device; a combined junction terminal protection structure having a RESURF (Reduced Surface Field) structure, the RESURF structure comprising a first biasing field plate electrically connecting to the active area and a ferroelectric material layer positioned below the first biasing field plate and in contact with the first biasing field plate. The high voltage semiconductor device structure may further assist in raising breakdown voltage (BV) of the device and meanwhile effectively reduce on-resistance (Ron) of the device compared with current junction terminal protection structure, and then miniaturization of the device structure may be fulfilled more easily. Further, the process may be performed easily because only common deposition and patterning processes of Hf-oxide ferroelectric layer should be added to current process.

7 Claims, 5 Drawing Sheets

(51) Int. Cl.
*H01L 29/66* (2006.01)
*H01L 29/78* (2006.01)

(58) Field of Classification Search
CPC ............. H01L 29/2003; H01L 29/7397; H01L 29/0619; H01L 29/0623; H01L 29/0649; H01L 29/0878; H01L 29/402; H01L 29/408; H01L 29/43; H01L 29/66712; H01L 29/66734; H01L 29/7395; H01L 29/7811; H01L 29/7813; H01L 29/861; H01L 29/404; H01L 29/66333; H01L 29/7398; H01L 29/7823
USPC ........................................................ 257/339
See application file for complete search history.

(56) References Cited

U.S. PATENT DOCUMENTS

2014/0346597 A1\* 11/2014 Feilchenfeld ....... H01L 29/7816
438/286
2019/0229193 A1 7/2019 Toh et al.
2019/0334032 A1\* 10/2019 Ho .................... H01L 29/66659

\* cited by examiner

HIGH VOLTAGE SEMICONDUCTOR DEVICE COMPRISING A COMBINED JUNCTION TERMINAL PROTECTION STRUCTURE WITH A FERROELECTRIC MATERIAL

FIELD OF THE INVENTION

The present invention relates to the technology field of high voltage semiconductor devices, and especially relates to a high voltage semiconductor device comprising a combined junction terminal protection structure with a ferroelectric material.

BACKGROUND OF THE INVENTION

The ability to withstand high voltage of PN junctions of periphery cells dominates the ability to block high voltage across the power semiconductor devices. Currently, a shallow planar junction as resulted from the planar technology, has curved columnar junction along edge and a spherical junction on corner, due to diffused ions of a dopant, higher electric field occurs at the edge and corners, so as to initiate early avalanche breakdown in these areas. As such, a blocking (breakdown) voltage of a PN junction would be lowered. Furthermore, it is often the avalanche breakdown is initiated at a surface of device due to a higher local surface electric field than a bulk electric field as related to the interfacial charges. A junction terminal protection structure is a special protection structure for reducing a local electrical field and raising a surface breakdown voltage reliably in order to achieve an actual breakdown voltage approaching an ideal value of an ideal planar junction. In a lateral conductive device, the junction terminal protection structures are usually distributed over a drift region; in a vertical conductive device, they are usually distributed around a periphery of an active area, as auxiliary structures of the PN junction for blocking an external high voltage across the device.

Currently, the junction terminal protection structures of a high voltage power semiconductor device are mainly based on planar technology and are formed with extending structures at periphery around a main junction (as rings). These extending structures, such as junction terminal extension (JTE) structure, field limiting ring (FLR) structure, deep trench terminal ($DT^2$) structure, field plate/floating field plate (FP, FFP) or a variable lateral doping (VLD) structure, etc., widen a depletion region of a main junction outwardly so as to decrease their internal electric field or the peak electrical field at the periphery of the main junction; and eventually, the breakdown voltage would be raised. Such junction termination structures are large in size, for example, they are about 180 μm in width for a device with blocking voltage in a range of 1200V. As the large size of junction termination structure helps the blocking voltage during off-state, it will not help conduct current during on-state but only increasing the average on-resistance of the power device. Generally, to ensure the breakdown voltage and scaling down the whole device, these junction termination structures may be effectively integrated in the device, but in such a case, process is complex and cost is high.

SUMMARY OF THE INVENTION

In view of drawbacks of the current technology, an object of the present invention is to provide a high voltage semiconductor device comprising a combined junction termination protection structure with a ferroelectric material to solve problems in conventional junction termination protection structure, e.g. complex process, large area, high cost or large on-resistance (normalized to area), etc.

To fulfill above-mentioned object and other related object(s), the present invention provides a high voltage semiconductor device comprising a combined junction terminal protection structure with a ferroelectric material, the high voltage semiconductor device comprises:

an active area formed with the high voltage semiconductor device;

a combined junction terminal protection structure having a RESURF (Reduced Surface Field) structure, the RESURF structure comprising a first biasing field plate electrically connecting to the active area and a ferroelectric material layer positioned below the first biasing field plate and in contact with the first biasing field plate.

Optionally, the high voltage semiconductor device comprises a silicon-based, SiC-based or GaN-based lateral or vertical power device, and the RESURF structure is applied in a drift region of the lateral power device or a junction terminal area of the vertical power device.

Optionally, the lateral power device comprises a LDMOS power device, and the vertical power device comprises a PiN power device, a VDMOS power device, or an IGBT power device.

Optionally, the lateral power device is LDMOS power device, the first biasing field plate electrically connects to a gate of the LDMOS power device, the RESURF structure further comprises a top doping layer of a first doping type and/or a berried layer of a second doping type, opposite to the first doping type, formed sequentially below the ferroelectric material layer, and the ferroelectric material layer is isolated from the top doping layer of the first doping type with a field oxide layer.

Optionally, the combined junction terminal protection structure further comprises at least one of a junction terminal extension structure, a field limiting ring structure, a deep trench terminal structure and a second biasing field plate electrically connecting to the active area.

Optionally, the second biasing field plate is formed on the first biasing field plate and isolated with an interlayer dielectric layer, and a lateral distance between a free end of the second biasing field plate and a free end of the first biasing field plate is greater than a thickness of the interlayer dielectric layer.

Optionally, the first biasing field plate is polysilicon field plate, and the second biasing field plate is metal field plate.

Optionally, the ferroelectric material layer comprises hafnium dioxide-based material doped with aluminum and/or zirconium.

As mentioned above, according to the high voltage semiconductor device having the combined junction terminal protection structure with a ferroelectric material of the present invention, the semiconductor power device can raise the breakdown voltage BV and reduce on-resistance (Ron), miniaturize the device size; and it may be easily integrated into a current manufacturing process by simply adding steps of deposition, photolithography, and etching of ferroelectric materials.

Figure 1:
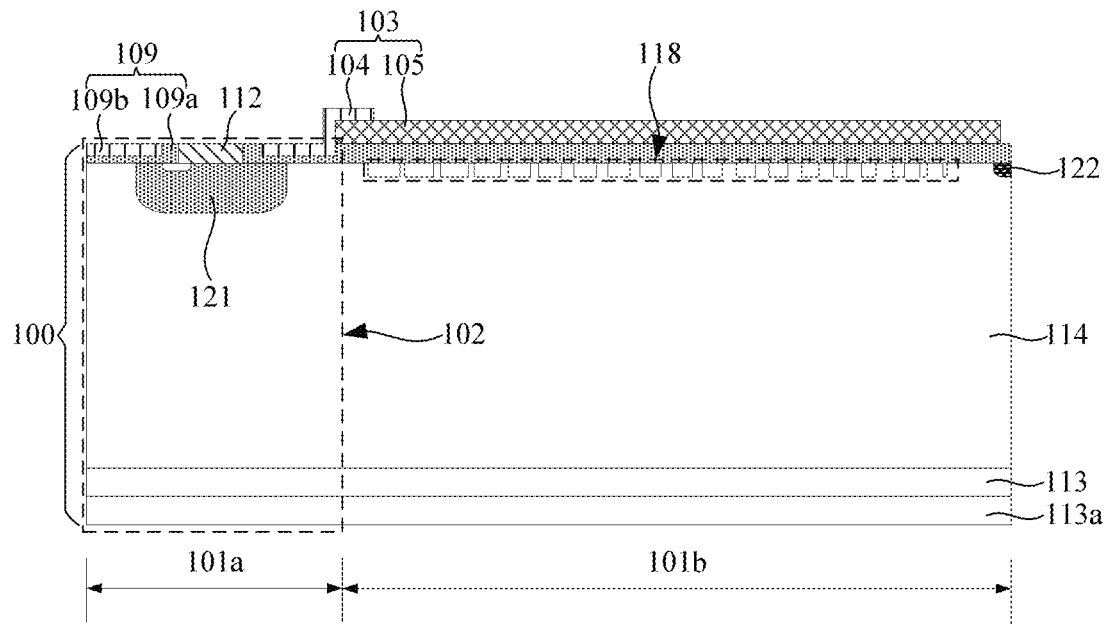
FIG. 1 shows a cross-sectional view of an IGBT power device comprising a combined junction terminal protection structure with a ferroelectric material of according to a first embodiment of the present invention.

REFERENCE SIGNS 100 substrate
101a active area
101b junction terminal area
102 high voltage semiconductor device
103 RESURF
104 first biasing field plate
105 ferroelectric material layer
106 N type top doping layer
107 P type berried layer
108 field oxide layer
109 gate
109a gate dielectric layer
109b gate polysilicon layer
110 drain
110a drain metal layer
110b drain region
111 second biasing field plate
112 emitter
113 collector
113a collector metal layer
114 drift region
115 interlayer dielectric layer
116 anode
117 cathode
117a ohmic contact layer
118 JTE structure
120 DT$^2$ structure
121 bulk region
122 cut-off ring
123 source
123a source region
124 PN junction region
L lateral distance
D thickness of the interlayer dielectric layer
S1~S4 steps

DESCRIPTION OF EMBODIMENTS OF THE INVENTION

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

Please refer to FIGS. 1 to 8. Please note that the drawings provided here are only for examples but not limited to the specific number or scale shown therein. When implementing the examples according to the drawings, condition, number and proportion of each element may be changed and arrangement of the elements may be in a more complex way.

First Embodiment

As shown in FIG. 1, the present embodiment provides a high voltage semiconductor device comprising a combined junction terminal protection structure with a ferroelectric material, and the high voltage semiconductor device comprises:

an active area 101a formed with the high voltage semiconductor device 102;

a combined junction terminal protection structure having a RESURF (Reduced Surface Field) structure 103, the RESURF structure 103 comprising a first biasing field plate 104 electrically connecting to the active area 101a and a ferroelectric material layer 105 positioned below the first biasing field plate 104 and in contact with the first biasing field plate 104.

Please note that the combined junction terminal protection structure has the same function as that of a current high voltage power device, i.e. preventing from early breakdown at a periphery of a main PN junction of the device to increase voltage withstand ability, and meanwhile preventing from an excessively high surface electric field to promote reliability.

The high voltage semiconductor device of the present embodiment may be vertical power device or lateral power device made with any proper semiconductor materials, for example, silicon-based, SiC-based or GaN-based lateral or vertical power device. The combined junction terminal protection structure having the RESURF structure 103 of the present embodiment may be applied at a junction terminal area of the vertical power device or a drift region of the lateral power device.

The vertical power device in the present embodiment may be PiN power device, VDMOS power device, or IGBT power device, and the lateral power device may be LDMOS power device.

The combined junction terminal protection structure may comprise the RESURF structure 103 only, or the RESURF structure 103 along with a typical junction termination protection structure to form the combined junction termination protection structure, such as junction terminal extension structure (abbreviated as JTE structure), field limiting ring structure (abbreviated as FLR structure), deep trench terminal structure (abbreviated as DT$^2$ structure), floating field plate structure, etc. Further, the RESURF structure 103 may be one single biasing field plate electrically connecting to the active area, such as the first biasing field plate 104; may be double biasing field plate electrically connecting to the active area, such as the composed field plate structure of the first biasing field plate 104 and the second biasing field plate 111 (not shown in FIG. 1 for simplicity).

For example, the material of the ferroelectric material layer 105 may be chosen from any current proper ferroelectric material, such as PZT, SBT, etc., and preferably, in the present embodiment, the material of the ferroelectric material layer 105 may be comprise hafnium dioxide-based ferroelectric material doped with aluminum and/or zirconium, which is an environmental-friendly ferroelectric material used in CMOS process that effectively reduce pollution to the environment.

A cross-sectional view of an IGBT power device comprising a combined junction terminal protection structure with a ferroelectric material of according to a first embodiment of the present invention is shown in FIG. 1. An IGBT power device 102 is of a planar gate type, and its structure is mainly identical to that of a current typical IGBT power device, comprising: an emitter 112 of the IGBT power device 102 formed both in and on an active area 101a of a substrate 100, a gate 109 constructed by a gate dielectric layer 109a and a gate polysilicon layer 109b, a bulk region 121, a collector 113 and a collector metal layer 113a. Please note that in FIG. 1, only a basic structure of the current IGBT power device 102 is shown; however, it is readily to be understood that the IGBT power device 102 of the planar gate type in the present embodiment may comprise other current design(s) promoting performance of the device, other than the basic structure. The combined junction terminal protection (JTE) structure of the IGBT power device 102 may comprise JTE structure 118 formed in a junction termination area 101b of the substrate 100 and a RESURF structure 103 formed on the JTE structure 118, in which the first biasing field plate 104 in the RESURF structure 103 electrically connects to the gate 109, and the JTE structure 118 is isolated from the RESURF structure 103 with an insulating layer. Preferably, the insulating layer may be formed during forming the gate dielectric layer 109a, and made with the same material as that of the gate dielectric layer 109a; the first biasing field plate 104 may be formed during forming the gate polysilicon layer 109b, and made with the same material as that of the and gate polysilicon layer 109b, i.e. polysilicon material.

An N type IGBT power device is taken for example to describe an operating principle of the RESURF structure 103 in the following paragraphs. It is readily to be understood that the operating principle of the RESURF structure 103 of a P type IGBT power device consists to that of the N type IGBT power device.

Figure 2:
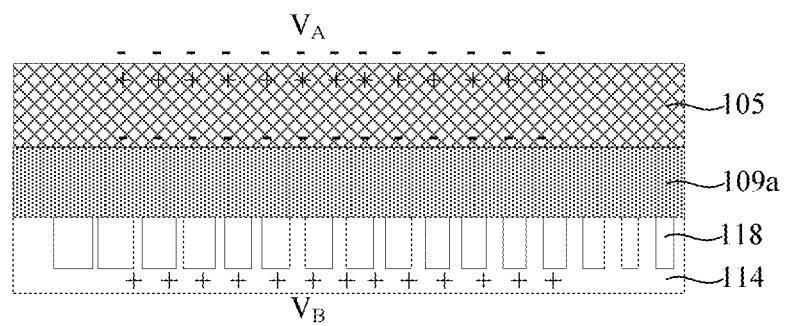
FIG. 2 shows a schematic diagram illustrating a RESURF structure of the IGBT power device having the combined junction terminal protection structure of the ferroelectric material in FIG. 1 at a turning-off status.

FIG. 2 shows the way of polarization of the ferroelectric material layer 105 of the RESURF structure 103 when the IGBT power device is in a turn-off status. In a turn-off status, a potential $V_A$ of the first biasing field plate 104 having an equipotential connection to the gate 109b is in a low potential, compared with a bulk potential $V_B$, so as to form an external electric field along with a direction which is from $V_B$ toward $V_A$. At this time, in the ferroelectric material layer 105 in the external electric field, a polarized electric field from $V_A$ toward $V_B$ is generated. The closer the ferroelectric material layer 105 is to the gate 109 laterally, the stronger an intensity of the polarized electric field is. The polarized electric field may induce more depletion region in the JTE structure 118 to further increase the breakdown voltage BV of the device.

Figure 3:
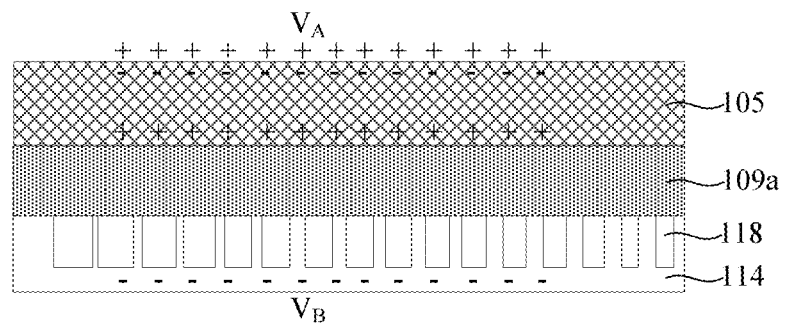
FIG. 3 shows a schematic diagram illustrating a RESURF structure of the IGBT power device having the combined junction terminal protection structure of the ferroelectric material in FIG. 1 at a turning-on status.

FIG. 3 shows the way of polarization of the ferroelectric material layer 105 of the RESURF structure 103 when the IGBT power device is in a turn-on status. In a turn-on status, the potential $V_A$ of the first biasing field plate 104 having the equipotential connection to the gate 109b is in a high potential, compared with the bulk potential $V_B$, so as to form an external electric field along with a direction which is from $V_A$ toward $V_B$. At this time, in the ferroelectric material layer 105 in the external electric field, a polarized electric field from $V_B$ toward $V_A$ is generated. The closer the ferroelectric material layer 105 is to the gate 109 laterally, the stronger the intensity of the polarized electric field is. The polarized electric field may induce electrons so as to effectively decrease the on-resistance (Ron) at turn-on state. Thus, the ferroelectric layer can raise the BV in turn-off and also decrease the Ron in turn-on and also to fulfill miniaturization of the device structure.

Aforesaid operating principle of the RESURF structure 103 is illustrated with the IGBT power device for example; however, the operating principle may be applied to other semiconductor high voltage devices which will not be repeated in the following paragraphs.

When applying the RESURF structure of the present embodiment, the breakdown voltage BV may be raised in turn-off and the on-resistance Ron may be lowered in turn-on based on the current junction termination protection structure. When implementing the present embodiment, the RESURF structure and current junction termination protection structure with ferroelectric layer may be combined to apply both structures to satisfy the requirement of device performance, for example, in FIG. 1, the RESURF structure and the JTE structure with ferroelectric layer are combined into one application.

Figure 4:
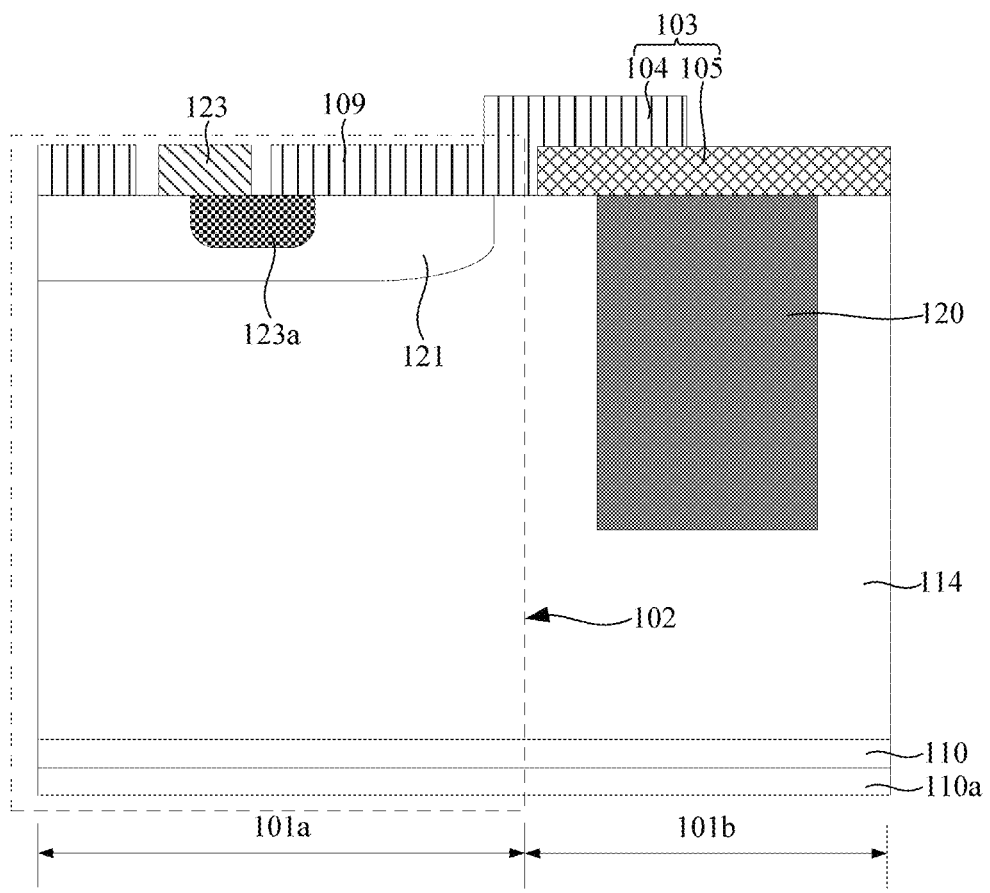
FIG. 4 shows a cross-sectional view of a planar gate VDMOS power device comprising a combined junction terminal protection structure with a ferroelectric material according to the first embodiment of the present invention.

FIG. 4 shows a cross-sectional view of a VDMOS power device of a planar gate type comprising a combined junction terminal protection structure with a ferroelectric material, and its structure is basically the same as that of a current typical VDMOS power device 102 of the planar gate type, comprising: a source 123 formed both in and on an active area 101a of a substrate, a source region 123a, a gate 109 (with a gate dielectric underneath not shown here for simplicity), a bulk region 121, a drain 110 and a drain metal layer 110a. Please note that only a basic structure of the planar gate VDMOS power device 102 is shown in, and it is readily to be understood that the VDMOS power device 102 of the planar gate type in the present embodiment may comprise other current design(s) promoting performance of the device, other than the basic structure. The combined junction terminal protection structure of the VDMOS power device 102 of the planar gate type may comprise a RESURF structure 103 formed both in and on a $DT^2$ structure 120 of a junction termination area 101b of the substrate, in which, a passivation protection layer (not shown) is generally positioned on a surface of the $DT^2$ structure 120, and the first biasing field plate 104 in the RESURF structure 103 electrically connects to the gate 109, the ferroelectric layer 105. Is underneath the RESURF structure 103.

Figure 5:
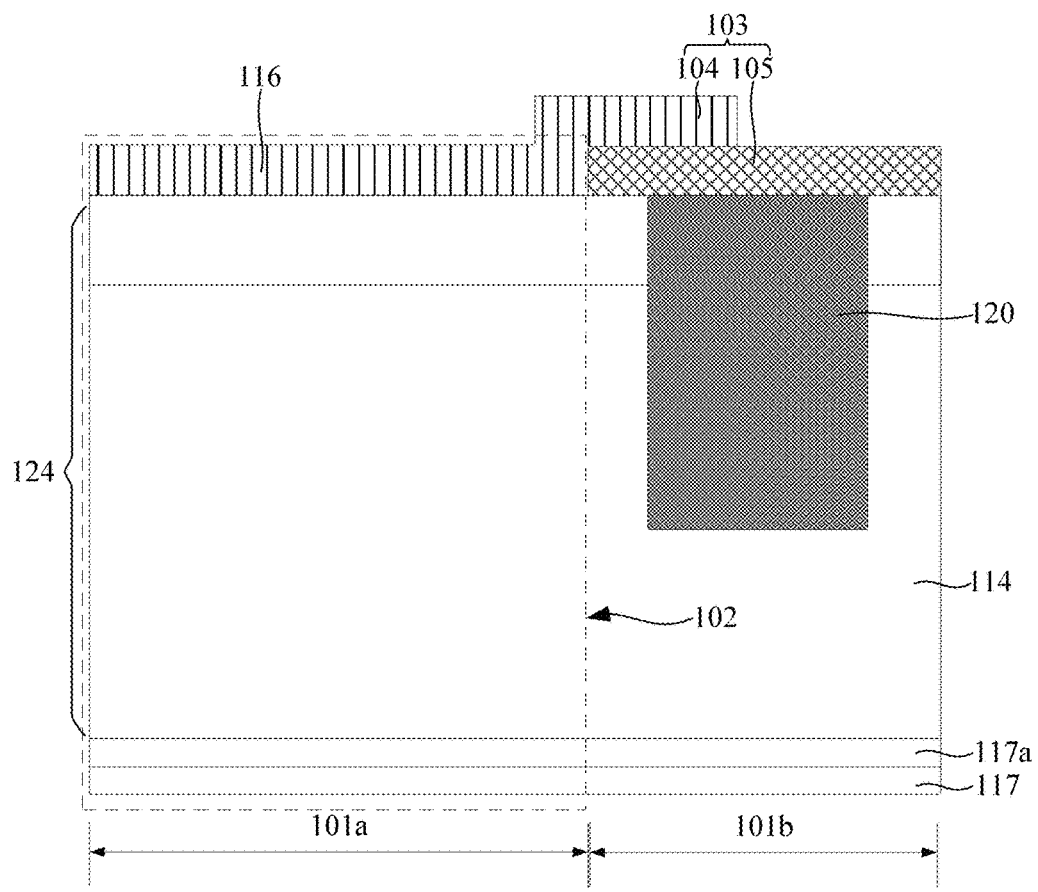
FIG. 5 shows a cross-sectional view of a high voltage diode device comprising a combined junction terminal protection structure with a ferroelectric material according to the first embodiment of the present invention.

FIG. 5 shows a cross-sectional view of a high voltage diode device comprising a combined junction terminal protection structure with a ferroelectric material, and its structure is basically the same as that of a current typical high voltage diode device 102, comprising: an anode 116 formed both in and on an active area 101a of a substrate, a PN junction region 124, an ohmic contact layer 117a and a cathode 117. Please note that only a basic structure of the high voltage diode device 102 is shown in, and it is readily to be understood that the high voltage diode device 102 in the present embodiment may comprise other current design(s) promoting performance of the device, other than the basic structure. The combined junction terminal protection structure of the high voltage diode device 102 may comprise a RESURF structure 103 formed both in and on a $DT^2$ structure 120 of a junction terminal area 101b of the substrate, in which, a passivation protection layer (not shown) is generally positioned on a surface of the $DT^2$ structure 120, and the first biasing field plate 104 in the RESURF structure 103 electrically connects to the anode 116, the ferroelectric layer 105 is below the RESURF structure 103 and above the $DT^2$ structure 120.

Figure 6:
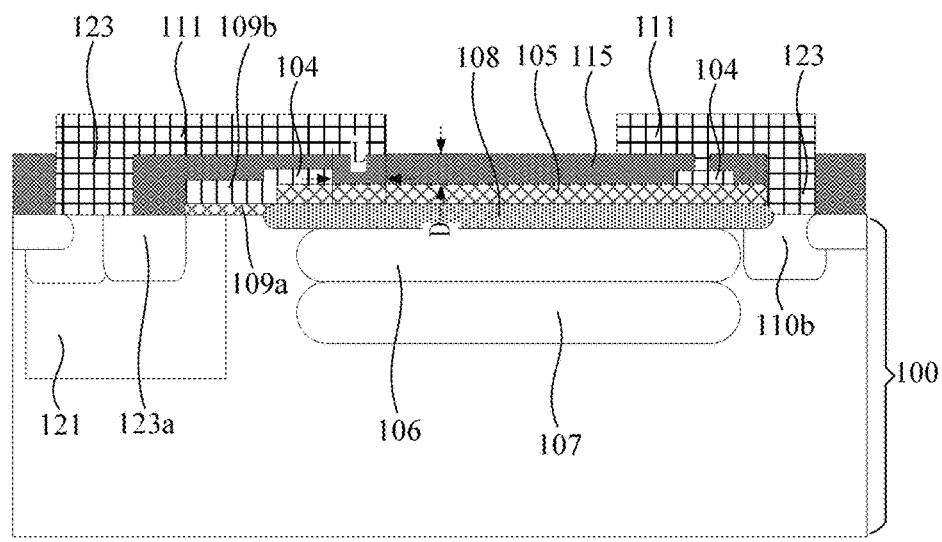
FIG. 6 shows a cross-sectional view of a LDMOS device comprising a combined junction terminal protection structure with a ferroelectric material according to the first embodiment of the present invention.

FIG. 6 shows a cross-sectional view of a LDMOS power device comprising a combined junction terminal protection structure with a ferroelectric material, and a N type LDMOS power device is taken for example. It is readily to be understood that a P type LDMOS power device may be formed with proper variation of polarization and conductivity type of dopants, as common knowledge of the technology field. The structure of the N type LDMOS power device structure is basically the same as that of a current typical LDMOS power device 102, comprising: a source region 123a formed in a bulk region 121, a gate 109 constructed by a gate dielectric layer 109a and a gate polysilicon layer 109b, and a drain region 110b. Please note that only a basic structure of the planar gate LDMOS power device 102 is shown in, and it is readily to be understood that the LDMOS power device 102 in the present embodiment may comprise other current design(s) promoting performance of the device, other than the basic structure. A RESURF structure 103 of the combined junction termination protection structure of the LDMOS power device 102 may comprise, from an upper side to a lower side, a first biasing field plate 04 formed in a drift region of the LDMOS power device, the ferroelectric material layer 105, a field oxide layer 108 for isolation, a N type top doping layer 106 and a P type berried layer 107. The first biasing field plate 104 electrically connects to the gate 109b and the drain region 110b, and preferably, the first biasing field plate 104 and the polysilicon layer 109b may be formed at the same time, and the first biasing field plate 104 and the polysilicon layer 109b may be made with the same polysilicon material. Please note that either of the N type top doping layer 106 and the P type berried layer 107 of FIG. 6 may be used along with the first biasing field plate 104 and the ferroelectric material layer 105, both of them may be used along with the first biasing field plate 104 and the ferroelectric material layer 105, and they may be used without the first biasing field plate 104 and the ferroelectric material layer 105, because the combination may depend on actual requirements. Preferably, the RESURF structure may further comprise a second biasing field plate 111 formed on the first biasing field plate 104, and the first and second biasing field plate 104, 110 may be electrically isolated from each other with an interlayer dielectric layer 115. The second biasing field plate 111 may electrically connect to the source region 123a and the drain region 110b through a metal contact 123. The same operating principle works in the present embodiment, and therefore when applying the second biasing field plate 111, the breakdown voltage (BV) may be further increased at turn-off and the on-resistance (Ron) may be reduced at turn-on. In the manufacturing process, the second biasing field plate 111 may be formed at same time as a metal layer of the device after forming the contact 123 of the LDMOS device. The metal layer may be used not only for interconnection but also serving as the second biasing field plate 111. To simplify the process, the material of the second biasing field plate 111 may be metal material. Preferably, a lateral distance L between a free end of the second biasing field plate 111 and a free end of the first biasing field plate 104 may be greater than a thickness D of the interlayer dielectric layer 115.

Second Embodiment

The present embodiment provides a method of making a high voltage semiconductor device comprising a combined junction terminal protection structure with a ferroelectric material. With the method, the high voltage semiconductor device comprising the combined junction terminal protection structure with the ferroelectric material of the first embodiment may be made; however, the high voltage semiconductor device of the first embodiment is not limited to the method disclosed in the present embodiment, and therefore, it is readily to be understood that the device of the first embodiment may be made by performing other manufacturing method, i.e. the first embodiment stands for all the implementations with the device structure of the first embodiment. Please refer to the first embodiment for effects of the device structure formed with the manufacturing method of the present embodiment, and they are not repeated here.

Figure 7:
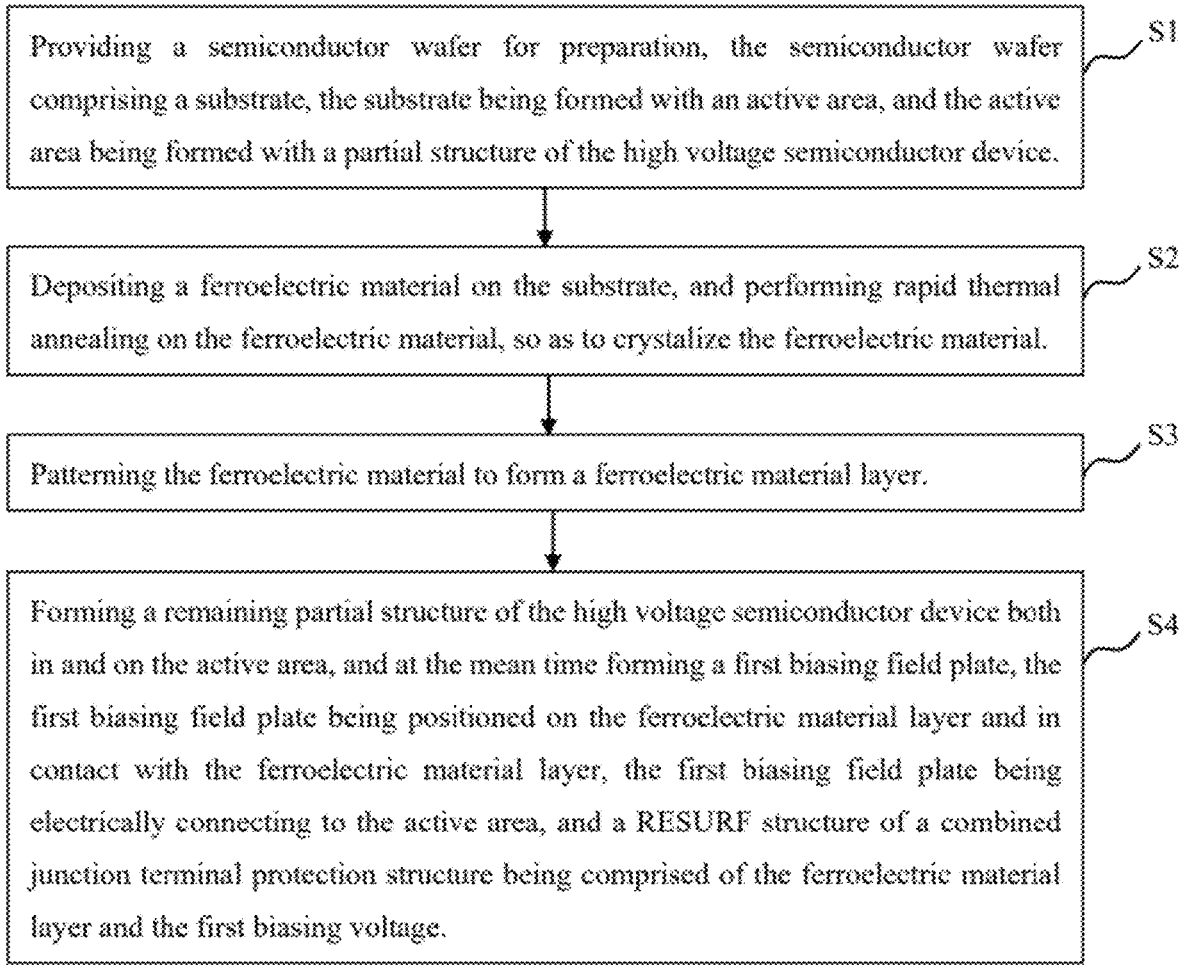
FIG. 7 shows a flow chart of a method of making a high voltage semiconductor device comprising a combined junction terminal protection structure with a ferroelectric material according to a second embodiment of the present invention.
Figure 8:
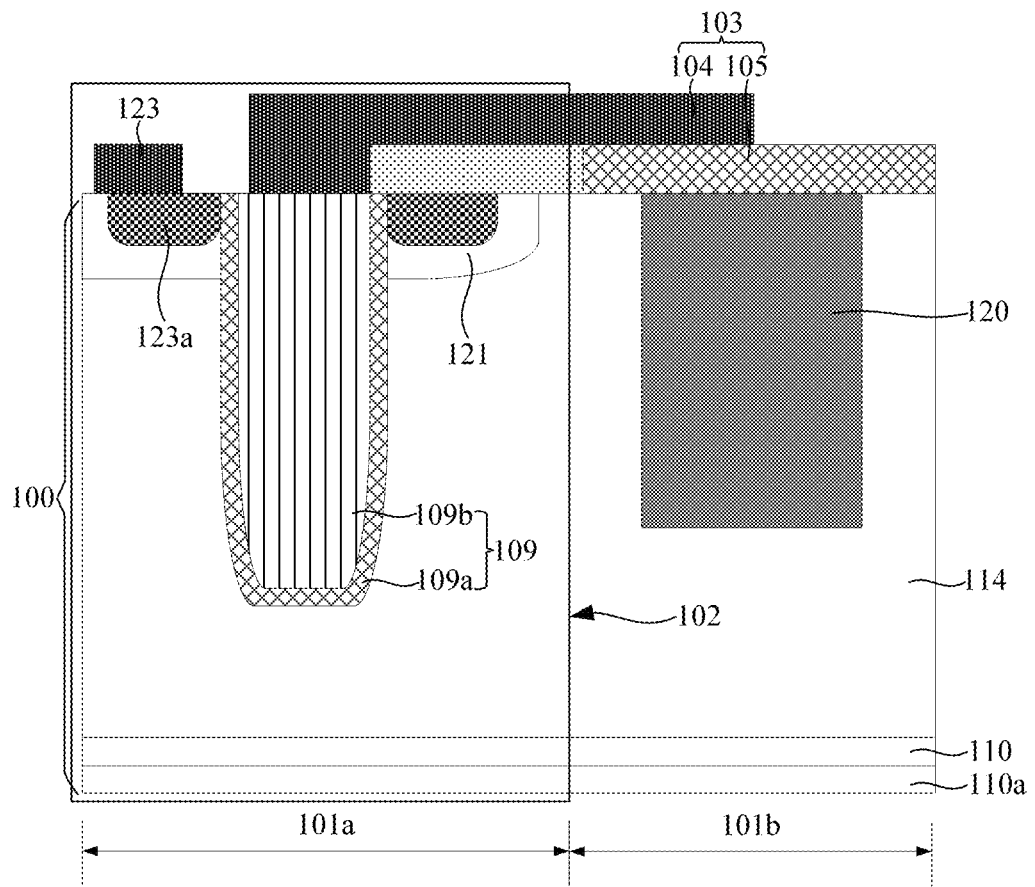
FIG. 8 shows a cross-sectional view of a VDMOOS power device comprising a combined junction terminal protection structure with a ferroelectric material having the RESURF structure made with the method of FIG. 7.

FIGS. 7 and 8 show the method of making the high voltage semiconductor device comprising the combined junction terminal protection structure with the ferroelectric material, comprising:
providing a semiconductor wafer for preparation, the semiconductor wafer comprising a substrate 100, the substrate 100 being formed with an active area 101a, and the active area 101a being formed with a partial structure of the high voltage semiconductor device 102;
depositing a ferroelectric material on the substrate 100, and performing rapid thermal annealing on the ferroelectric material, so as to crystalize the ferroelectric material;
patterning the ferroelectric material to form the ferroelectric material layer 105;
forming a remaining partial structure of the high voltage semiconductor device 102 both in and on the active area 101a, and at the mean time forming a first biasing field plate 104, the first biasing field plate 104 being positioned on the ferroelectric material layer 105 and in contact with the ferroelectric material layer 105, the first biasing field plate 104 being electrically connecting to the active area 104a, and a RESURF structure 103 of the combined junction terminal protection structure being comprised of the ferroelectric material layer 105 and the first biasing voltage 104.

FIG. 8 shows a perspective view of a cross-sectional structure of a trench gate type VDMOS power device. Taking the trench gate type VDMOS power device for example, the making method would be illustrated easily. The current trench gate type VDMOS power device 102 is basic in structure; however, it is readily to be understood that the VDMOS power device 102 in the present embodiment may comprise other current design(s) promoting performance of the device, other than the basic structure, and steps of making the same may apply a current typical process. Please keep in mind to pay attention to the process steps of the RESURF structure 103 in the present embodiment.

Specifically, at first, a semiconductor wafer for preparation is provided. The semiconductor wafer comprises a substrate 100, and an active area 101a and a junction terminal area 101b are formed in the substrate 100. A drift region 114 formed in the active area 101a and the junction terminal area 101b, and a gate trench is formed on a surface of the active area 101a.

Then, the ferroelectric material is deposited on the substrate 100, and rapid thermal annealing on the ferroelectric material is performed, so as to crystalize the ferroelectric material; then, the ferroelectric material is patterned to form the ferroelectric material layer 105.

Then, a gate dielectric layer 109a and a gate polysilicon layer 109b are formed in the gate trench, and the gate dielectric layer 109a and the gate polysilicon layer 109b forms the gate 109.

Then, a bulk region 121 is formed on the surface of the active area 101a, and a source region 123a is formed in the bulk region 121.

Then, a metal contact is formed on the surface of the active area 101a.

Then, a patterned metal layer electrically connecting to the metal contact is formed, at this time, the patterned metal layer is further served as a first biasing field plate 104 which electrically connecting to the gate 109b.

Last, bask-side processing of the substrate 100 is performed, and a step of forming a drain 110 and a drain metal layer 110a at a bask-side surface of the substrate 100 is comprised.

For example, a physical vapor deposition process or an atomic layer deposition process may be performed to form the ferroelectric material, and a temperature of the rapid thermal annealing for the ferroelectric material may be within 400° C.~1000° C. to ensure the crystallization of the ferroelectric material.

For example, the junction terminal protection structures of the trench gate type VDMOS power device may comprise a current typical structure, such as junction terminal extension structure (JTE), field limiting ring structure (FLR), deep trench terminal structure ($DT^2$), floating field plate structure (FFP), etc., and may comprise the second biasing field plate 111 shown in FIG. 6, and any single one or some of the structures may be but not limited to applied along with the RESURF structure, depending on the requirements. The structure shown in FIG. 8 comprises current typical $DT^2$ structure which may be formed at the same time as forming the gate 109. As shown in FIG. 6, when the structure comprises a second biasing field plate 111, the second biasing field plate 111 may be formed at the same time as forming a metal layer after forming a metal contact.

For example, the first biasing field plate 104 is a polysilicon field plate, the second biasing field plate 111 is a metal field plate.

For example, the material of the ferroelectric material layer 105 may be chosen from any current proper ferroelectric material, such as PZT, SBT, etc., and preferably, the material of the ferroelectric material layer 105 may be hafnium dioxide-based material doped with aluminum and/or zirconium, which is an CMOS technology friendly material.

For example, the high voltage semiconductor device 102 may be vertical power device or lateral power device made with any proper semiconductor materials, such as silicon-based, SiC-based or GaN-based lateral or vertical power device. The combined junction terminal protection structure having the RESURF structure 103 of the present embodiment may be applied to a junction terminal area of the vertical power device or a drift region of the lateral power device. Preferably, the lateral power device comprises a LDMOS power device, and the vertical power device comprises a PiN power device, a VDMOS power device, an IGBT power device.

As mentioned above, according to the high voltage semiconductor device having the combined junction termination protection structure with the ferroelectric material of the present invention of the present invention, the semiconductor device can further raise the breakdown voltage (BV) at turn-off and reduce on-resistance (Ron) at turn-on based on the current junction termination protection structure. The device can be reduced by shorten the JTE width while keep same BV; further, the manufacturing process is simple by adding steps of deposition and patterning ferroelectric layer into current manufacturing process. Therefore, the present invention effectively overcomes various drawbacks of the current technology and is highly valuable for the industry.

It is to be understood that these embodiments are not meant as limitations of the invention but merely exemplary descriptions of the invention with regard to certain specific embodiments. Indeed, different adaptations may be apparent to those skilled in the art without departing from the scope of the annexed claims. In all instances, the scope of such claims shall be considered on their own merits in light of this disclosure, and such claims accordingly define the invention(s), and their equivalents or variations, that are protected thereby.

What is claimed is:

1. A high voltage semiconductor device comprising a combined junction terminal protection structure with a ferroelectric material, characterized by: the high voltage semiconductor device comprises:
   an active area formed with the high voltage semiconductor device;
   a combined junction terminal protection structure having a RESURF (Reduced Surface Field) structure, the RESURF structure comprising a first biasing field plate electrically connecting to the active area, a second biasing field plate electrically connecting to the active area and a ferroelectric material layer positioned below the first biasing field plate and in contact with the first biasing field plate, wherein the second biasing field plate is formed on the first biasing field plate and isolated with an interlayer dielectric layer, and a lateral distance between a free end of the second biasing field plate and a free end of the first biasing field plate is greater than a thickness of the interlayer dielectric layer.

2. The high voltage semiconductor device comprising a combined junction terminal protection structure with a ferroelectric material according to claim 1, characterized by:
   wherein the high voltage semiconductor device comprises a silicon-based, SiC-based or GaN-based lateral or vertical power device, and the RESURF structure is applied in a drift region of the lateral power device or a junction terminal area of the vertical power device.

3. The high voltage semiconductor device comprising a combined junction terminal protection structure with a ferroelectric material according to claim 2, characterized by:
   wherein the lateral power device comprises a LDMOS power device, and the vertical power device comprises a PiN power device, a VDMOS power device, or an IGBT power device.

4. The high voltage semiconductor device comprising a combined junction terminal protection structure with a ferroelectric material according to claim 3, characterized by:
   wherein the lateral power device is LDMOS power device, the first biasing field plate electrically connects to a gate of the LDMOS power device, the RESURF structure further comprises a top doping layer of a first doping type and/or a berried layer of a second doping type, opposite to the first doping type, formed sequentially below the ferroelectric material layer, and the ferroelectric material layer is isolated from the top doping layer of the first doping type with a field oxide layer.

5. The high voltage semiconductor device comprising a combined junction terminal protection structure with a ferroelectric material according to claim 1, characterized by: wherein the combined junction terminal protection structure further comprises at least one of a junction terminal extension structure, a field limiting ring structure and a deep trench terminal structure and a second biasing field plate electrically connecting to the active area.

6. The high voltage semiconductor device comprising a combined junction terminal protection structure with a ferroelectric material according to claim 5, characterized by:
   wherein the first biasing field plate is polysilicon field plate, and the second biasing field plate is metal field plate.

7. The high voltage semiconductor device comprising a combined junction terminal protection structure with a ferroelectric material according to claim 1, characterized by:
   wherein the ferroelectric material layer comprises hafnium dioxide-based material doped with aluminum and/or zirconium.

\* \* \* \* \*